(12) United States Patent
Soer et al.

(10) Patent No.: US 8,263,950 B2
(45) Date of Patent: Sep. 11, 2012

(54) RADIATION SOURCE

(75) Inventors: Wouter Anthon Soer, Nijmegen (NL); Maarten Marinus Johannes Wilhelmus Van Herpen, Heesch (NL); Kurt Gielissen, Eindhoven (NL); Martin Jacobus Johan Jak, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 183 days.

(21) Appl. No.: 12/788,903

(22) Filed: May 27, 2010

(65) Prior Publication Data

US 2011/0128519 A1    Jun. 2, 2011

Related U.S. Application Data

(60) Provisional application No. 61/227,562, filed on Jul. 22, 2009.

(51) Int. Cl.
*G03B 27/54* (2006.01)
*G21K 5/00* (2006.01)

(52) U.S. Cl. ............. 250/492.1; 250/493.1; 250/504 R; 355/67; 355/77

(58) Field of Classification Search .................. 250/489, 250/492.1, 492.2, 492.21, 492.22, 492.23, 250/492.3, 493.1, 503.1
See application file for complete search history.

(56) References Cited

U.S. PATENT DOCUMENTS

| | | | |
|---|---|---|---|
| 5,691,541 A * | 11/1997 | Ceglio et al. | 250/492.1 |
| 6,919,054 B2 * | 7/2005 | Gardner et al. | 422/186 |
| 6,927,405 B1 * | 8/2005 | Bonnet et al. | 250/493.1 |
| 7,365,350 B2 * | 4/2008 | Tran et al. | 250/504 R |
| 7,649,187 B2 * | 1/2010 | Hergenhan et al. | 250/504 R |
| 7,705,333 B2 * | 4/2010 | Komori et al. | 250/504 R |
| 7,829,871 B2 * | 11/2010 | Nakasuji et al. | 250/492.1 |
| 7,897,941 B2 * | 3/2011 | Franken et al. | 250/492.2 |
| 2001/0004104 A1 * | 6/2001 | Bijkerk et al. | 250/492.2 |
| 2004/0119896 A1 * | 6/2004 | Kean et al. | 349/25 |
| 2006/0138362 A1 * | 6/2006 | Bakker et al. | 250/504 R |
| 2006/0243927 A1 * | 11/2006 | Tran et al. | 250/504 R |
| 2008/0173641 A1 * | 7/2008 | Hadidi et al. | 219/690 |
| 2009/0272917 A1 * | 11/2009 | Soer et al. | 250/492.1 |
| 2010/0044591 A1 * | 2/2010 | Loopstra et al. | 250/492.2 |
| 2011/0109892 A1 * | 5/2011 | Van Herpen et al. | 355/67 |

* cited by examiner

*Primary Examiner* — Bernard E Souw
(74) *Attorney, Agent, or Firm* — Sterne, Kessler, Goldstein & Fox P.L.L.C

(57) ABSTRACT

A radiation source may include a radiation emitter for emitting radiation, a collector for collecting radiation emitted by the radiation emitter, and an outlet configured, in use, to introduce a cooled gas into the radiation source.

15 Claims, 2 Drawing Sheets

RADIATION SOURCE

CROSS REFERENCE TO RELATED APPLICATIONS

Figure 1:
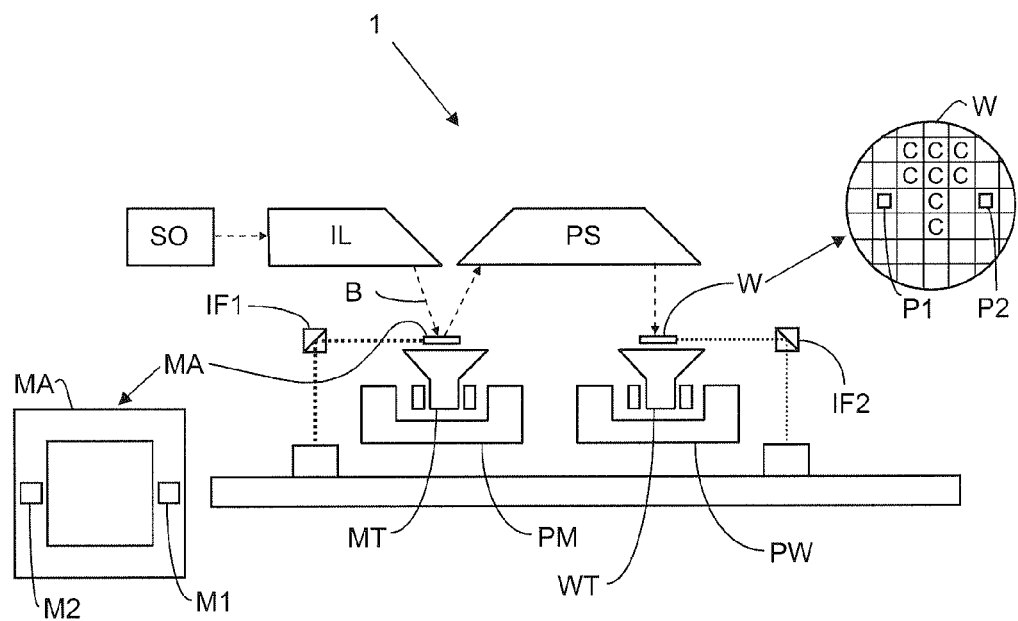

This applications claims benefit under 35 U.S.C. §119(e) to U.S. Provisional Patent Application No. 61/227,562, filed Jul. 22, 2009, which is incorporated by reference herein in its entirety.

BACKGROUND

1. Field

Embodiments of the present invention relate to a radiation source, and to a lithographic apparatus which is in connection with or includes such a radiation source.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet (EUV) radiation having a wavelength within the range of 5-20 nm, for example within the range of 13-14 nm. It has further been proposed that radiation with a wavelength of less than 10 nm could be used, for example 6.7 nm or 6.8 nm. In the context of lithography, wavelengths of less than 10 nm are sometimes referred to as 'beyond EUV'.

Extreme ultraviolet radiation and beyond EUV radiation may be produced using a plasma. The plasma may be created for example by directing a laser at particles of a suitable material (e.g., tin), or by directing a laser at a stream of a suitable gas or vapor, such as Xe gas or Li vapor. Alternatively, the plasma may be created using an electrical discharge. The resulting plasma emits extreme ultraviolet radiation (or beyond EUV radiation), which is collected using a collector such as a normal incidence collector or mirrored grazing incidence collector, which receives the extreme ultraviolet radiation and focuses the radiation into a beam.

In addition to extreme ultraviolet radiation, the plasma produces debris in the form of particles, such as thermalized atoms, ions, nanoclusters, and/or microparticles. The debris is projected, together with the extreme ultraviolet radiation, towards the collector and may cause damage to the collector.

It is desirable to prevent debris from coming into contact with and, for example, coating or damaging the collector. Coating of the collector may, for example, reduce the reflectivity of the collector, reducing the amount of radiation that may be collected and used in the patterning of a substrate.

Debris from plasma-based extreme ultraviolet radiation sources is commonly suppressed using a buffer gas. Debris repeatedly collides with constituent parts (e.g., atoms or molecules) of the buffer gas, and these collisions cause the debris to slow down and/or be deflected from their original path. The slowing down and/or deflection of the debris can be used to obviate or mitigate the problem of the debris coming into contact with the collector. After the debris has been slowed down and/or deflected, the debris may, for example, be pumped away (e.g., out of the radiation source) and/or intercepted by a debris trap (for example, a foil trap or the like).

The degree to which the debris is suppressed (i.e., the suppression factor) depends on the number of buffer gas atoms (or, for example, molecules) that debris (for example, a debris atom or the like) encounters on its way through the buffer gas. At constant temperature and volume, the number of buffer gas atoms is proportional to the buffer gas pressure (from the ideal gas law $pV=nRT$). The buffer gas is often characterized in terms of the integrated pressure along the trajectory of the debris. The suppression can be improved by increasing the integrated pressure. Increasing the integrated pressure can be achieved by increasing the pressure, or by increasing the distance over which the pressure is applied. However, both of these solutions are difficult to implement in practice. For instance, the pressure is typically limited by a maximum operating pressure of the radiation source, since too high a pressure inhibits the expansion of the plasma that emits extreme ultraviolet radiation. The distance over which the pressure may be applied is limited by the space between the point at which radiation is generated (i.e., the location of the radiation emitter, for example, the plasma) and the collector. Increasing this distance increases the size of the radiation source, which is undesirable.

SUMMARY

A radiation source is provided that solves one or more problems of earlier systems, whether identified herein or elsewhere, or which provides an alternative radiation source to those of earlier systems.

According to a first aspect of the present invention there is provided a radiation source including: a radiation emitter for emitting radiation; a collector for collecting radiation emitted by the radiation emitter; and an outlet configured, in use, to introduce a cooled gas into the radiation source.

The cooled gas may be arranged to be cooled prior to introduction into the radiation source. The cooled gas may be arranged to be introduced into the radiation source in a compressed state. The gas may be arranged to be introduced in the form of a pressurized liquid which is allowed to evaporate to form the cooled gas. The radiation source may further include a nebulizer for nebulizing the liquid.

The outlet may be configured to introduce the cooled gas at a location in-between the radiation emitter and the collector.

The outlet may be configured to introduce the cooled gas at a location in-between the radiation emitter and an exit aperture of the source.

The radiation source may include one or more further outlets, each further outlet being arranged to introduce a cooled gas into the radiation source at a different location within the radiation source.

The radiation source may be a plasma-based radiation source, such as a discharge produced plasma radiation source, or a laser produced plasma radiation source.

The collector may be a normal incidence collector or a grazing incidence collector.

The radiation source may be configured to generate radiation having a wavelength of substantially 20 nm or less.

The cooled gas may be arranged to have a temperature below an ambient temperature (e.g., of the environment in which the radiation source is located), or a temperature that is substantially the same as a boiling point of the gas. The cooled gas may be arranged to have that temperature by appropriate cooling, pressurization or the like.

The cooled gas may be arranged, in use, to serve as one or more of: a buffer gas; a gas for cooling a component of the radiation source; and a gas for cleaning a component of the radiation source. The gas may be arranged to perform such a function by, for example, the composition of the gas, or the location of the introduction of the gas into the radiation source.

According to a second aspect of the present invention there is provided a radiation source arrangement including: a radiation source according to the first aspect of the present invention; and a source of cooled gas, pressurized gas or liquefied gas in connection with the outlet of the radiation source.

According to a third aspect of the present invention there is provided a lithographic apparatus in connection with, or including, a radiation source or radiation source arrangement according to the first and/or second aspect of the present invention.

According to a fourth aspect of the present invention there is provided a method of operating a radiation source or radiation source arrangement according to any of the first, second or third aspects of the present invention, the method including: introducing a cooled gas into the radiation source via an outlet.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts an embodiment of a lithographic apparatus.

Figure 2:
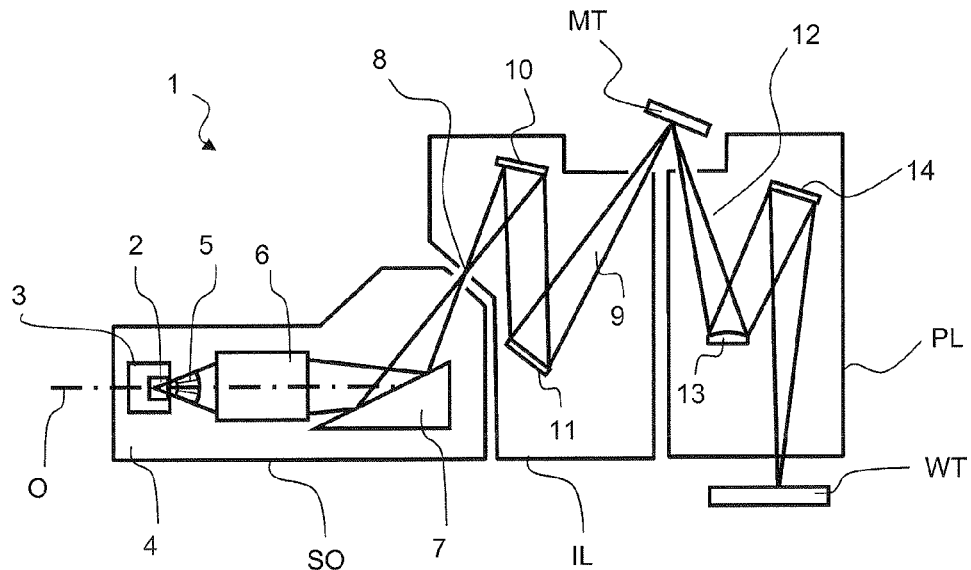

FIG. 2 schematically depicts a detailed schematic illustration of the lithographic apparatus of FIG. 1.

Figure 3:
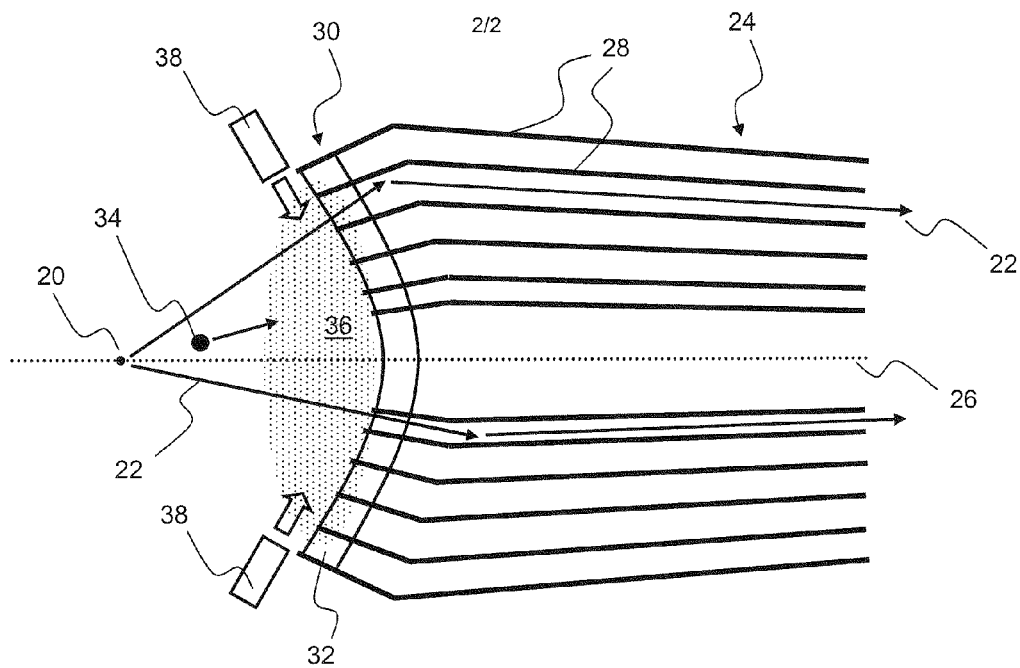

FIG. 3 schematically depicts part of a radiation source according to an embodiment of the invention.

Figure 4:
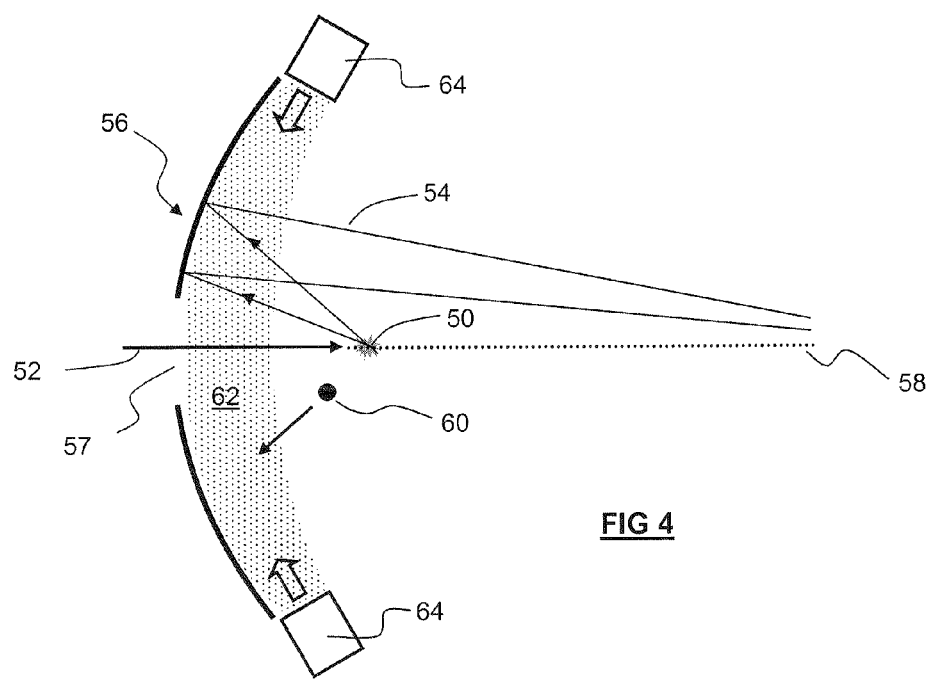

FIG. 4 schematically depicts part of a radiation source according to another embodiment of the invention.

The features and advantages of embodiments of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 1. Apparatus 1 include an illumination system (illuminator) IL configured to condition a radiation beam B (e.g., EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to radiation beam B by patterning device MA onto a target portion C (e.g., including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of lithographic apparatus 1, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically in an EUV radiation (or beyond EUV) lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in a EUV (or beyond EUV) radiation lithographic apparatus the optical elements will be reflective. However, other types of optical element may be used. The optical elements may be in a vacuum. Any use of the term "projection lens" herein may be considered as synonymous with the more general term "projection system".

As here depicted, apparatus 1 is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, illuminator IL receives a radiation beam from a radiation source SO. The source and the lithographic apparatus may be separate entities. In such cases, the source is not considered to form part of the lithographic apparatus and the radiation beam is passed from source SO to illuminator IL with the aid of a beam delivery system including, for example, suitable directing mirrors and/or a beam expander. In other cases the source may be an integral part of the lithographic apparatus. Source SO and illuminator IL, together with the beam delivery system if required, may be referred to as a radiation system. In accordance with an embodiment of the present invention, lithographic apparatus 1 may include, or be in connection with, a radiation source or radiation source arrangement according to an embodiment of the present invention, described in detail below.

Illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator and a condenser. The illuminator may be used to condition radiation beam B to have a desired uniformity and intensity distribution in its cross-section.

Radiation beam B is incident on the patterning device (e.g., mask MA), which is held on the support structure (e.g., mask table MT), and is patterned by the patterning device. Having been reflected by mask MA, radiation beam B passes through projection system PS, which focuses the beam onto a target portion C of substrate W. With the aid of second positioner PW and position sensor IF2 (e.g., an interferometric device, linear encoder or capacitive sensor), substrate table WT can be moved accurately, e.g., so as to position different target portions C in the path of radiation beam B. Similarly, first positioner PM and another position sensor IF1 can be used to accurately position mask MA with respect to the path of radiation beam B, e.g., after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus 1 could be used in at least one of the following modes:

1. In step mode, mask table MT and substrate table WT are kept essentially stationary, while an entire pattern imparted to the radiation beam is projected onto a target portion C at one time (i.e., a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e., a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 shows lithographic apparatus 1 of FIG. 1 in more detail. Referring to FIG. 2, lithographic apparatus 1 includes a radiation source SO, an illumination optics unit IL, and projection system PL. Radiation source SO includes a radiation emitter 2 which may include a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis O. Partial pressures of, e.g., 10 Pa of Xe or Li vapor or any other suitable gas or vapor may be required for efficient generation of the radiation. In some embodiments, tin may be used. The radiation emitted by radiation emitter 2 is passed from a source chamber 3 into a collector chamber 4. In another embodiment (not shown), a plasma configured to emit EUV radiation may be created by directing a laser beam at a droplet of fuel, such as a droplet of tin.

Collector chamber 4 includes a debris trap 5 and grazing incidence collector 6 (shown schematically as a rectangle). Radiation allowed to pass through collector 6 is reflected off a grating spectral filter 7 to be focused in a virtual source point 8 at an aperture in collector chamber 4. From collector chamber 4, a beam of radiation 9 is reflected in illumination optics unit IL via first and second normal incidence reflectors 10, 11 onto a reticle or mask positioned on reticle or mask table MT. A patterned beam 12 is formed which is imaged in projection optics system PL via first and second reflective elements 13, 14 onto a substrate (not shown) held on a substrate table WT. More elements than shown may generally be present in illumination optics unit IL and projection system PL.

As discussed above, debris generated in a radiation source (e.g., a plasma-based radiation source) may be suppressed by the use of a buffer gas. A suppression factor related to the use of the buffer gas can be improved by increasing the integrated pressure of the buffer gas. Such an increase can be achieved by increasing the pressure of the buffer gas, or the distance over which the pressure is applied. However, it is difficult to achieve such an increase in pressure or an increase in distance in practice. In one instance, the pressure is typically limited by a maximum operating pressure of the radiation source, because too high a pressure may inhibit the expansion of the plasma that emits radiation. In another instance, the distance over which the pressure is applied is limited by the space between the radiation emitter (e.g., the plasma or the plasma formation site) and the collector. Increasing this distance increases the size of the radiation source, which is undesirable.

It is therefore desirable to be able to improve debris suppression using a buffer gas, but without increasing the gas pressure of the radiation source or the distance over which the pressure is applied.

In accordance with an embodiment of the present invention, one or more problems of earlier systems may be obviated or mitigated by introducing a cooled buffer gas into the radiation source. The cooled buffer gas may be introduced in the radiation source from an outlet. A cooled buffer gas may be a buffer gas having a temperature that is lower than the ambient temperature. For instance, the gas may be cooled to such an extent that the gas is at a temperature which is substantially that of the boiling point of the buffer gas. The buffer gas may be cooled prior to introduction into the radiation source, for example, by a cooling and/or compressing arrangement. Alternatively, the buffer gas may be introduced into the radiation source in a compressed state, and allowed to expand and cool. The compression may be such that the gas is introduced into the radiation source in an initial liquid form or state (which may be pressurised), the liquid then being allowed to expand and evaporate in the radiation source to form the cooled buffer gas.

The use of a cooled buffer gas increases the number of gas atoms for a given pressure and volume (in accordance with the ideal gas law). By increasing the number of gas atoms for a given pressure and volume, debris suppression is increased while at the same time not affecting the operating pressure of the source, or increasing the distance over which that pressure is applied. An additional benefit associated with the use of a cooled buffer gas is that the cooled buffer gas may be used to cool, or contribute to the cooling of, one of the components of the radiation source (which may include, for example, a collector, a debris suppression arrangement, and the like), thereby allowing the radiation source to run at a higher power within an associated higher output of radiation.

The radiation source may be any radiation source in which a buffer gas (or a gas, in general) is used. For instance, the cooled buffer gas may be introduced into a plasma-based radiation source, which is known to generate debris at the same time as generating radiation. In one example, the radiation source may be a discharge produced plasma (DPP) radiation source. In another example, the radiation source may be a laser produced plasma (LPP) radiation source. The radiation source may be configured to generate radiation having a wavelength of substantially 20 nm or less, for which sources debris suppression is highly desirable.

The introduction of cooled buffer gas into the radiation source may be advantageous in comparison with, for example, cooling of the gas within the radiation source itself. If the gas were to be cooled within the radiation source, one or more cooling arrangements would need to be provided within the radiation source. Thus, if the gas were to be cooled within the radiation source, the build cost, size, complexity of design or maintenance costs may increase.

Specific embodiments of the present invention will now be described, by way of example only, with reference to FIGS. 3 and 4. Principles applicable to both embodiments will be described after the description of the Figures.

FIG. 3 schematically depicts a side-on view of a discharge produced plasma (DPP) radiation source. The radiation source includes a radiation emitter 20 for emitting radiation. Radiation emitter 20 is, in this embodiment, a discharge produced plasma formed by establishing an electrical discharge in or across a fuel (e.g., a gas, vapor or liquid). Radiation emitter 20 emits radiation 22. Radiation 22 may be (or include) extreme ultraviolet radiation, or radiation with a shorter wavelength.

Radiation 22 is collected by a collector 24 which collects radiation 22 and directs radiation 22 along an optical axis 26 of the radiation source. Collector 24 includes a plurality of nested shells 28. At the opening of shells 28 adjacent to radiation emitter 20, a debris trap 30 is provided. Debris trap 30 may, for example, include one or more magnets or foils 32 which are used to trap debris that enters collector 24. In other embodiments, debris trap 30 may be located in-between radiation emitter 20 and collector 24, and may not form part of collector 24.

As well as generating radiation 22, the radiation source also generates debris 34. Debris 34 may be in the form of particles, such as thermalized atoms, ions, nanoclusters, and/or microparticles. The debris is directed toward collector 24. This debris 34 may be suppressed, and thereby prevented from coming into contact with or entering collector 24, by the provision of a cooled buffer gas 36. Cooled buffer gas 36 is introduced into the radiation source by outlets 38. Cooled buffer gas 36 is introduced into the radiation source at a location which is in-between radiation emitter 20 and collector 24.

FIG. 4 schematically depicts a side-on view of a laser produced plasma (LPP) radiation source in accordance with an embodiment of the present invention. The radiation source includes a radiation emitter 50 for emitting radiation 54. In this embodiment, the radiation emitter is a laser produced plasma formed by directing a laser beam 52 at a fuel droplet, not shown in the Figure (for example, a droplet of tin). Radiation 54 may be (or include) extreme ultraviolet radiation, or radiation with a shorter wavelength.

Radiation 54 emitted by radiation emitter 50 is collected by a collector 56. Collector 56 may be a normal incidence collector 56. Collector 56 is, in this embodiment, provided with an aperture 57 through which laser beam 52 may be directed. Collector 56 collects radiation 54 and directs radiation 54 along an optical access 58 of the radiation source.

As well as generating radiation 54, the radiation source may also generate debris 60. Debris 60 may be in the form of particles, such as thermalized atoms, ions, nanoclusters, and/or microparticles. Debris 60 is also directed towards collector 56. This debris 60 may be suppressed, and thereby prevented from coming into contact with or entering collector 56, by the provision of a cooled buffer gas 62. Cooled buffer gas 62 is provided at a location which is in-between radiation emitter 50 and collector 56. Cooled buffer gas 62 may be introduced into the radiation source by outlets 64. Cooled buffer gas 62 may be directed along a collecting surface of collector 56, or may (in another embodiment, not shown) be directed through one or more apertures of collector 56.

A debris trap may also be provided. The debris trap may, for example, include one or more magnets or foils which are used to trap debris. The debris trap may be located in-between radiation emitter 50 and collector 56. Alternatively or additionally, the debris trap may partially surround radiation emitter 50. Alternatively or additionally, the debris trap may form part of or be attached to collector 56.

Many features or alternative features of the embodiments of the present invention are not unique to the embodiments shown in FIGS. 3 and 4, but are generally applicable. Such features and alternatives will now be described.

In one example, the cooled buffer gas may be introduced into the radiation source in a cooled state. For instance, the cooled buffer gas may be cooled prior to introduction into the radiation source by one or more cooling or compression arrangements or the like. For instance, the buffer gas may be arranged to be introduced into the radiation source in a compressed state and allowed to expand and cool in the radiation source. The buffer gas may be introduced into the radiation source in the form of liquid (for example, a pressurised liquid) which is allowed to expand and/or evaporate within the radiation source to thus form the cooled buffer gas. One or more nebulizers may be provided (for example adjacent to, in, or forming part of the outlets) for nebulizing the liquid. The nebulizer may be used to achieve a uniform distribution of a mist of fine droplets of the liquid and enhance the evaporation rate of the liquid.

As discussed above in both described embodiments, the cooled buffer gas may be introduced into the radiation source at a location that is in-between the radiation emitter and the collector. Alternatively or additionally, the outlets (or one or more additional outlets) may be configured to introduce the cooled buffer gas at a location that is in-between the radiator emitter and/or the collector and an exit aperture of the radiation source. An exit aperture may be an aperture through which radiation may pass after being collected by the collector. Cooled buffer gas introduced in-between the radiator emitter and/or the collector and an exit aperture of the radiation source may prevent debris passing into, onto or through further components of the lithographic apparatus, for example, an the illumination system or beam delivery system or the like.

One or more outlets for introducing cool buffer gas into the radiation source may be provided. The outlets may be configured to introduce cooled buffer gas at approximately the same location within the radiation source, or may be configured or arranged to introduce cooled buffer gas into the radiation source at different locations within the radiation source. For example, outlets may be configured to introduce cooled buffer gas between the radiation emitter and the collector, and between the radiation emitter and/or the collector and the exit aperture of the radiation source. The outlets may be configured (e.g., positioned, located, or oriented or the like) to provide cooled buffer gas as close as possible to a collecting surface of the collector (to maximise the density of the gas near the collector), but far enough away from the collector surface to reduce or eliminate the possibility of non-evaporated cooled buffer gas (e.g., in the form of a liquid or droplets of liquid) coming into contact with and being deposited on the collector surface. Such deposition might reduce the reflection of radiation from that part of the surface, reducing collection efficiency.

The outlets may be tubes, conduits or apertures in the radiation source. The tubes or conduits may be moveable, such that the location of the introduction of cooled gas can be changed. The outlets may be selectively opened and closed such that the location of the introduction of cooled gas can be changed.

The temperature of the cooled buffer gas at the outlet may be below ambient (e.g., room temperature). In an embodiment, the temperature of the buffer gas is substantially the same as (e.g., close to) the boiling point of the buffer gas (for example, 87.3K for argon, or 20.3K for hydrogen).

If a refresh rate of the cooled buffer gas (e.g., an introduction rate or flow rate into the radiation source) is sufficiently high, the average temperature of the cooled buffer gas in the radiation source will drop by almost the same amount as (i.e., may drop to being substantially equal to) the temperature of the cooled buffer gas at the outlet of the buffer gas. For example, if a normal average temperature of the buffer gas within the radiation source is 600K, a reduction of the inlet temperature from 293K to approximately 50K may result in the average temperature of the buffer gas dropping to approximately 400K. Thus, the number of gas atoms can be increased by a factor of 1.5 (proportional to the drop in temperature). As a result, debris suppression and source cooling can be improved without affecting the operating pressure of the radiation source.

A radiation source arrangement may be provided. The radiation source arrangement may include a radiation source according to an embodiment of the present invention. Furthermore, the radiation source arrangement may include a source of cooled buffer gas, pressurized buffer gas or liquefied buffer gas in connection with the outlet of the radiation source (i.e., the outlet via which the cooled buffer gas is to be introduced into the radiation source). The source of cooled buffer gas, pressurized buffer gas or liquefied buffer gas may be a tank or store or the like, or may be an active arrangement configured to produce or maintain cooled buffer gas, pressurized buffer gas or liquefied buffer gas (e.g., a pump, compressor, refrigeration system or the like). The outlet may be configured to introduce a cooled buffer gas into the radiation source by being in connection with such a source.

A lithographic apparatus (for example the lithographic apparatus described above in the relation to FIG. 1 or FIG. 2) may include, or be in connection with, a radiation source or radiation source arrangement according to any one or more embodiments of the present invention.

In the above embodiments, a cooled buffer gas has been described as being introduced into the radiation source. The cooled gas may alternatively or additionally perform a function other than acting as a buffer. For example, a cooled gas may be introduced to cool one or more components of the radiation source, or to clean one or more components of the radiation source. The cooled gas may thus be arranged, in use, to serve as one or more of: a buffer gas; a gas for cooling a component of the radiation source; and a gas for cleaning a component of the radiation source. As discussed above in relation to embodiments wherein the cooled gas served as a cooled buffer gas, the introduction of cooled gas into the radiation source may be advantageous in comparison with, for example, cooling of the gas within the radiation source itself. If the gas were to be cooled within the radiation source, one or more cooling arrangements would need to be provided within the radiation source. Thus, if the gas were to be cooled within the radiation source, the build cost, size, complexity of design or maintenance costs may increase.

Although the above description of embodiments of the invention relates to a radiation source which generates EUV radiation, the invention may also be embodied in a radiation source which generates 'beyond EUV' radiation, that is radiation with a wavelength of, for example, less than 10 nm. Beyond EUV radiation may, for example, have a wavelength of 6.7 nm or 6.8 nm. A radiation source which generates beyond EUV radiation may operate in the same manner as the radiation sources described above.

The description above is intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A radiation source comprising:
    a radiation emitter configured to emit radiation;
    a collector configured to collect radiation emitted by the radiation emitter; and
    an outlet configured to introduce a cooled gas into the radiation source,
    wherein the cooled gas suppresses an amount of debris generated by the radiation emitter from contacting or entering the collector.

2. The radiation source of claim 1, wherein the cooled gas is arranged to be cooled prior to introduction into the radiation source.

3. The radiation source of claim 1, wherein the cooled gas is arranged to be introduced into the radiation source in a compressed state.

4. The radiation source of claim 3, wherein the gas is arranged to be introduced as a pressurized liquid that evaporates to form the cooled gas.

5. The radiation source of claim 3, further comprising a nebulizer for nebulizing the liquid.

6. The radiation source of claim 1, wherein the outlet is configured to introduce the cooled gas at a location in-between the radiation emitter and the collector.

7. The radiation source of claim 1, wherein the outlet is configured to introduce the cooled gas at a location in-between the radiation emitter and an exit aperture of the source.

8. The radiation source of claim 1, further comprising one or more further outlets, the one or more further outlets being arranged to introduce a cooled gas into the radiation source at a different location within the radiation source.

9. The radiation source of claim 1, wherein the cooled gas is introduced at a temperature below an ambient temperature.

10. The radiation source of claim 1, wherein the cooled gas is arranged to serve as one or more of:
    a buffer gas;
    a gas for cooling a component of the radiation source; and
    a gas for cleaning a component of the radiation source.

11. A radiation source arrangement comprising:
    a radiation emitter configured to emit radiation;
    a collector configured to collect radiation emitted by the radiation emitter;
    an outlet configured to introduce a cooled gas into the radiation source; and
    a source of the cooled gas, pressurized gas or liquefied gas in connection with the outlet,
    wherein the cooled gas suppresses an amount of debris generated by the radiation emitter from contacting or entering the collector.

12. A lithographic apparatus comprising:
    a radiation source comprising:
        a radiation emitter configured to emit radiation;
        a collector configured to collect radiation emitted by the radiation emitter; and
        an outlet configured to introduce a cooled gas into the radiation source,
        wherein the cooled gas suppresses an amount of debris generated by the radiation emitter from contacting or entering the collector;
    a patterning device configured to pattern the radiation; and
    a projection system configured to direct the patterned radiation onto a substrate.

13. A method comprising:
    operating a radiation source comprising:
        a radiation emitter configured to emit radiation;
        a collector configured to collect radiation emitted by the radiation emitter; and
        an outlet configured to introduce a cooled gas into the radiation source;
    introducing the cooled gas into the radiation source via the outlet of the radiation source,
    wherein the cooled gas suppresses an amount of debris generated by the radiation emitter from contacting or entering the collector.

14. The method of claim 13, wherein the cooled gas is introduced to cool a part of the radiation source.

15. The radiation source of claim 1, wherein the cooled gas is introduced at a temperature that is substantially the same as a boiling point of the gas.

* * * * *